United States Patent
Lin et al.

(10) Patent No.: US 9,755,582 B2
(45) Date of Patent: Sep. 5, 2017

(54) SWITCH CIRCUIT, SAMPLING SWITCH CIRCUIT AND SWITCH CAPACITOR CIRCUIT

(75) Inventors: Jian-Ru Lin, Nantou County (TW); Shin-Syong Huang, Changhua County (TW)

(73) Assignee: Realtek Semiconductor Corp., HsinChu (TW)

( * ) Notice: Subject to any disclaimer, the term of this patent is extended or adjusted under 35 U.S.C. 154(b) by 905 days.

(21) Appl. No.: 13/561,063

(22) Filed: Jul. 29, 2012

(65) Prior Publication Data

US 2013/0154390 A1    Jun. 20, 2013

(30) Foreign Application Priority Data

Dec. 14, 2011    (TW) .............................. 100146154 A

(51) Int. Cl.
  *H02B 1/24*    (2006.01)
  *H03F 1/32*    (2006.01)
  *H03F 3/45*    (2006.01)

(52) U.S. Cl.
  CPC ....... *H03F 1/3211* (2013.01); *H03F 3/45475* (2013.01); *H03F 2203/45551* (2013.01)

(58) Field of Classification Search
  USPC ........................................................ 307/109
  See application file for complete search history.

(56) References Cited

U.S. PATENT DOCUMENTS

| | | | |
|---|---|---|---|
| 6,118,326 A * | 9/2000 | Singer et al. ................. | 327/390 |
| 2008/0012634 A1* | 1/2008 | Oyang .................... | H03F 3/005 330/9 |
| 2009/0322418 A1* | 12/2009 | Burke .................. | H03H 15/023 327/552 |

OTHER PUBLICATIONS

Cho et al. (A 9-bit 80 MS/s Successive Approximation Register Analog-to-Digital Converter With a Capacitor Reduction Technique), Jul. 2010, pp. 502-506.*
Ye et al. (An 8-bit 1 MHz Successive Approximation Register (SAR) A/D with 7.98 ENOB) Jun. 2001, pp. 139-142.*
Cai et al. (A 12bit 100MSps Pipelined ADC without Calibration) Oct. 2010, pp. 3547-3552.*
Young-Kyun Cho, "A 9-bit 80 MS/s Successive Approximation Register Analog-to-Digital Converter With a Capacitor Reduction Technique", Jul. 2010, p. 502-506.*
Xiaobo Cai, "A 12bit 100MSps pipelined ADC without calibration", Oct. 2010, p. 3547-3552.*
Ye et al. (An 8-bit 1 MHz Successive Approximation Register (SAR) With 7.98 ENOB) Jun. 2001, pp. 139-142.*
Cai et al. (A 12 bit 100MSps Pipelined ADC without Calibration) Oct. 2010, pp. 3547-3552.*

(Continued)

*Primary Examiner* — Rexford Barnie
*Assistant Examiner* — Xuan Ly
(74) *Attorney, Agent, or Firm* — Winston Hsu

(57) ABSTRACT

A switch circuit comprising: a plurality of switches; a switching module; and a capacitor, having a first terminal and a second terminal, wherein the first terminal is coupled to a predetermined voltage, and the second terminal is coupled to a control terminal of at least the switch in a conductive mode via the switching module, to thereby control a conductive state for the at least one switch.

8 Claims, 9 Drawing Sheets

(56) References Cited

OTHER PUBLICATIONS

Young-Kyun Cho; Young-Deuk Jeon; Jae-Won Nam; Jong-Kee Kwon, "A 9-bit 80 MS/s Successive Approximation Register Analog-to-Digital Converter With a Capacitor Reduction Technique", IEEE Transactions on Circuits and Systems II:Express Briefs, vol. 57, No. 7, p. 502-506, Jul. 2010.
Xiaobo Cai; Fule Li; Weitao Li; Chun Zhang; Zhihua Wang, "A 12bit 100MSps pipelined ADC without calibration", 2010 3rd International Congress on Image and Signal Processing (CISP2010), vol. 8, p. 3547-3552, IEEE EMB, Oct. 16-18, 2010.
Yafei Ye; Liyuan Liu; Fule Li; Dongmei Li; Zhihua Wang, "An 8-bit 1MHz Successive Approximation Register(SAR) A/D with 7.98 ENOB", 2011 IEEE International Conference on Anti-Counterfeiting, Security and Identification (ASID), p. 139~142, Jun. 24-26, 2001.
Yafei Ye et al., "An 8-bit 1MHz Successive Approximation Register (SAR) A/D with 7.98 ENOB", Jun. 2011, pp. 139-142, Jun. 26, 2011, Anti-Counterfeiting, Security and Identification (ASID), 2011 IEEE International Conference on.
Young-Kyun Cho et al., "A 9-bit 80 MS/s Successive Approximation Register Analog-to-Digital Converter With a Capacitor Reduction Technique", July 2010, pp. 502-506, Jul. 31, 2010, vol. 57, No. 7, IEEE Transactions on Circuits and Systems—II:Express Briefs.

\* cited by examiner

|  | Operating state 1 | Operating state 2 | Operating state 3 | Operating state 4 | Operating state 5 | Operating state 6 | Operating state 7 |
|---|---|---|---|---|---|---|---|
| $C_{1p}$ | V0 | − | + | + | + | − | − |
| $C_{2p}$ | V0 | − | + | + | V0 | − | V0 |
| $C_{3p}$ | V0 | − | + | V0 | V0 | V0 | V0 |
| $C_{1n}$ | V0 | + | − | − | − | + | + |
| $C_{2n}$ | V0 | + | − | − | V0 | + | V0 |
| $C_{3n}$ | V0 | + | − | V0 | V0 | V0 | V0 |
| The number of the switches are coupled | 3 | 3 | 3 | 3 | 3 | 3 | 3 |

FIG. 6

Operating state 4

US 9,755,582 B2

SWITCH CIRCUIT, SAMPLING SWITCH CIRCUIT AND SWITCH CAPACITOR CIRCUIT

BACKGROUND OF THE INVENTION

1. Field of the Invention

The present invention relates to a switch circuit, a sampling switch circuit and a switch capacitor circuit utilizing the switch circuit, and particularly relates to a switch circuit, a sampling switch circuit and a switch capacitor circuit utilizing the switch circuit, which share a single capacitor.

2. Description of the Prior Art

For recent circuits, the requirements for speed and linearity are extremely high, thus the resistance value for the switch in the circuit is supposed to be low. A MOSFET (Metal Oxide Semiconductor Field Effect Transistor) is a popular switch. For such kind of switch, enough voltage should be provided cross the gate terminal and the drain terminal thereof such that the switch can have a resistance value that is low enough. However, the conventional switch may have the problem of too large resistance value, since the operating voltage (Vdd) that the chip can provide to the switch is always non-enough such that un-sufficient voltage is generated cross the gate terminal and the drain terminal of the switch. Therefore, related techniques are developed to solve this problem.

SUMMARY OF THE INVENTION

One objective of the present invention is to provide a switch circuit and a switch capacitor circuit that can share a capacitor.

One embodiment of the present invention discloses a switch circuit, which comprises: a plurality of switches; a switching module; and a capacitor, having a first terminal and a second terminal, wherein the first terminal is coupled to a predetermined voltage, and the second terminal is selectively coupled to at least one of the plurality of switches via the switching module in a conductive mode.

One embodiment of the present invention discloses a switch capacitor circuit, which comprises: a plurality of switches; a switching module; and a voltage adjusting capacitor, for receiving a charging current thereby charged to a first predetermined voltage, having a first terminal and a second terminal, wherein the first terminal is coupled to a predetermined voltage, and the second terminal is selectively coupled to at least one of the plurality of switches via the switching module in a conductive mode.

In view of above-mentioned embodiments, the switch circuit according to the present invention can share a single voltage adjusting capacitor to a plurality of switches to significantly save circuit region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a schematic diagram illustrating each operating state for the switch capacitor circuit shown in FIG. 4.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The switch circuit according to the present invention will be detailedly described as below. It should be noted that some practical circuits are utilized as examples for explaining the switch circuit according to the present invention in the following embodiments. For example, the above-mentioned clock boost strapped switch circuit and the popular switch capacitor circuit are utilized as examples. However, it does not mean the switch circuit according to the present invention is limited to be applied to these circuits. The scope of the present invention should base on citation of claims.

Figure 1:
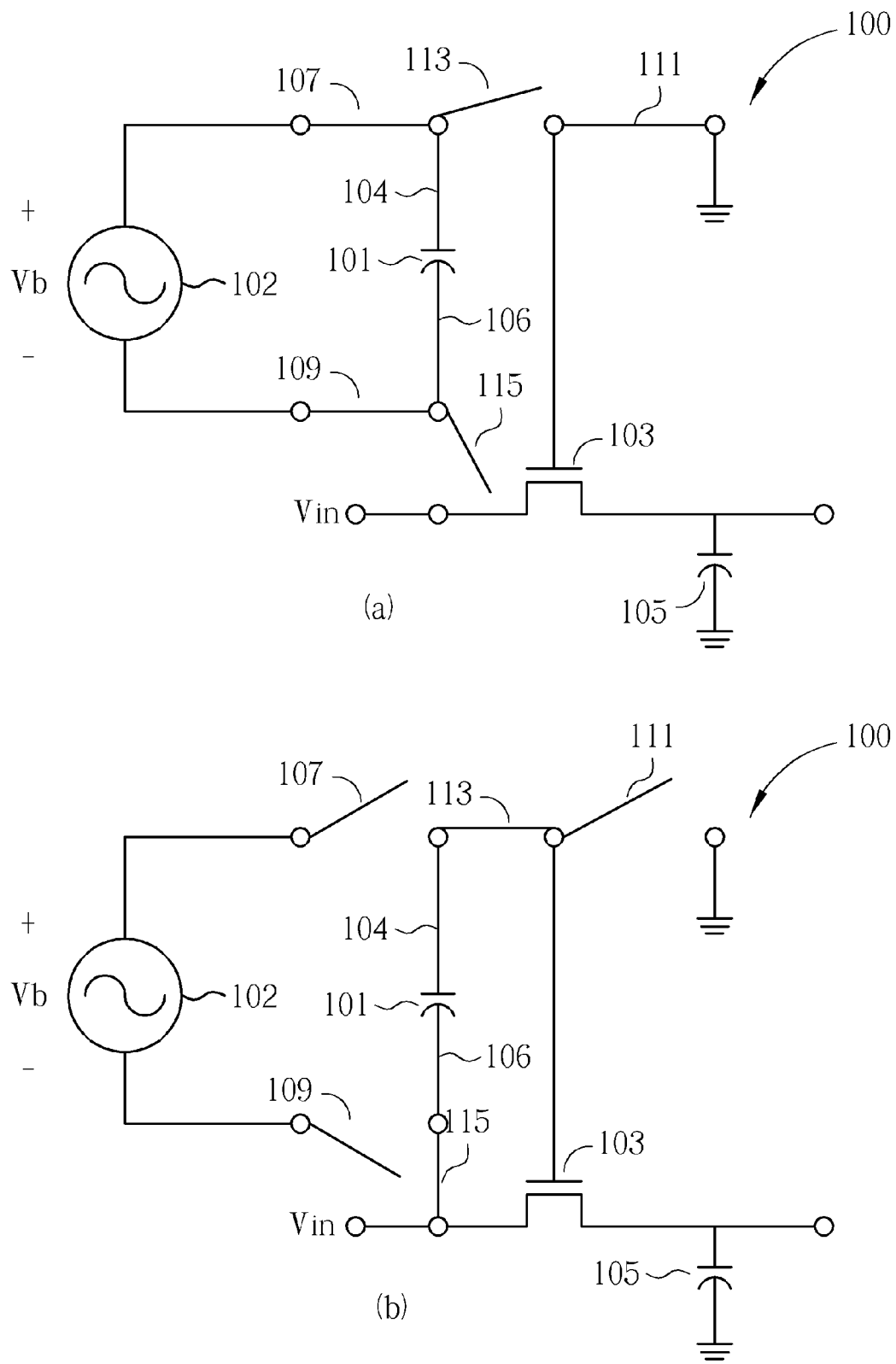
FIG. 1 is a circuit diagram illustrating a prior art clock boost strapped switch circuit.
Figure 2:
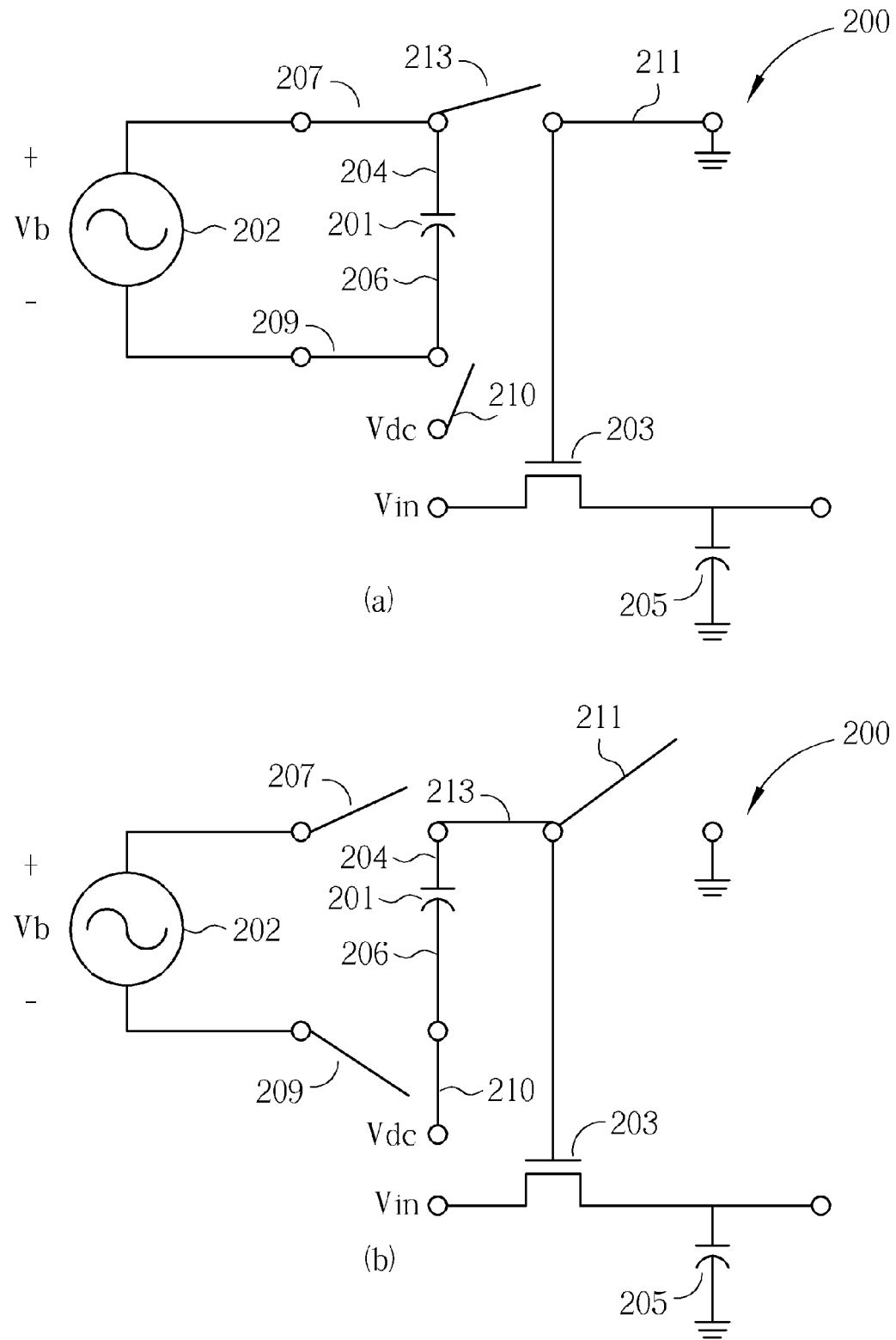
FIG. 2 and FIG. 3 are circuit diagrams illustrating the clock boost strapped switch circuit according to embodiments of the present invention.

FIG. 2 is a circuit diagram illustrating the clock boost strapped switch circuit 200 according to one embodiment of the present invention. Similar with FIG. 1, FIG. (a) in FIG. 2 indicates the maintaining mode and FIG. (b) indicates the sampling mode. Please refer to FIG. (a) of FIG. 2, the clock boost strapped switch circuit 200 includes a voltage adjusting capacitor 201, a switch (an NMOSFET in thus example) 203, a sampling capacitor 205 and a plurality of conductive devices 207-213. One of the differences between the clock boost strapped switch circuit 100 in FIG. 1 and the clock boost strapped switch circuit 200 in FIG. 2 is the device that the voltage adjusting capacitor is coupled to. In FIG. (b) of FIG. 1, one terminal 104 of the voltage adjusting capacitor 101 is coupled to a control terminal of the switch 103. Also, the terminal 106 is coupled to an input terminal of the switch 103, which receives the input signal Vin. However, in FIG. (b) of FIG. 2, one terminal 204 of the voltage adjusting capacitor 201 is coupled to a control terminal of the switch 203. Moreover, the terminal 206 is coupled to a predetermined voltage Vdc via a conductive 210, which is non-conductive in the mode shown in FIG. (a) of FIG. 2.

Figure 3:
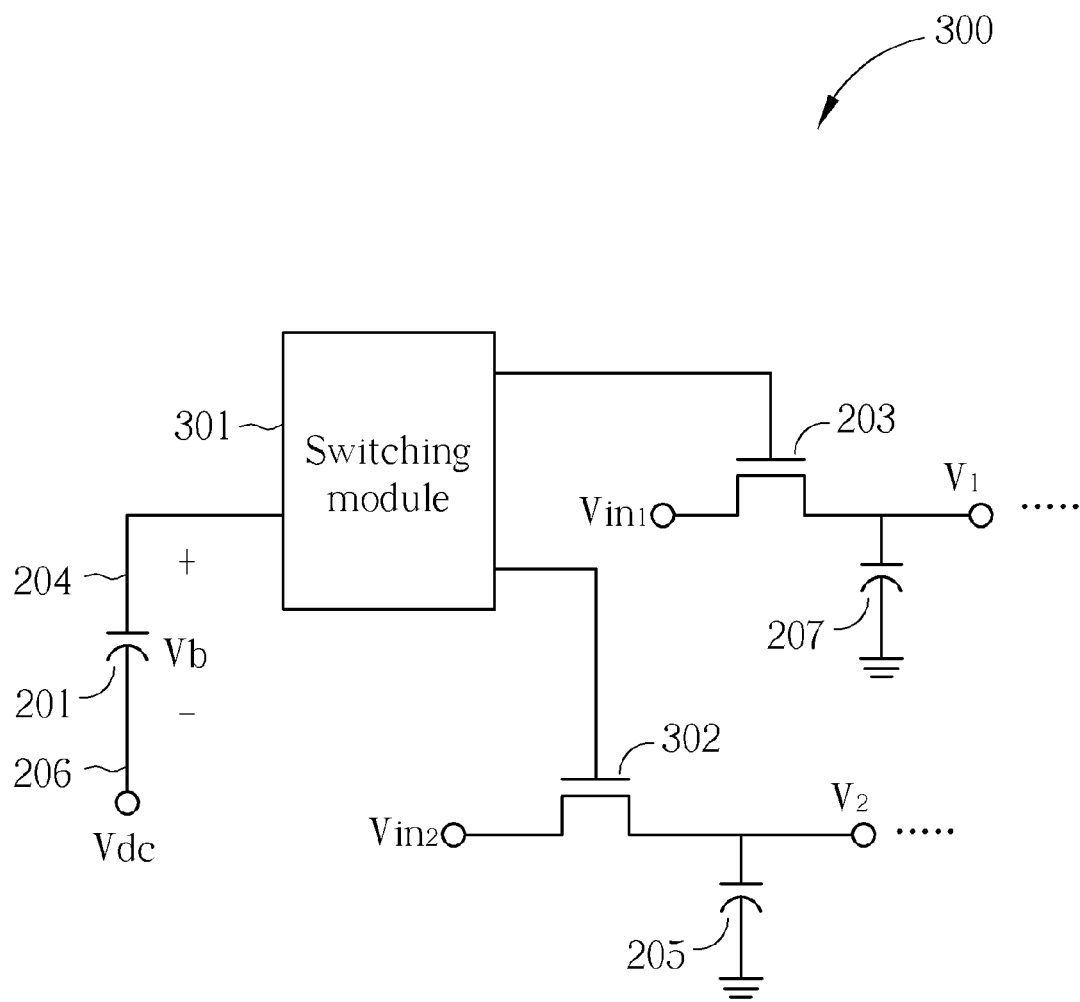

Besides the concept depicted in FIG. 2 that one terminal of the voltage adjusting capacitor 201 is coupled to the predetermined voltage Vdc, the input signals received by the device can have different voltages if the switch circuit includes a plurality of switches. Additionally, the switch circuit according to the present invention further includes the feature for sharing the voltage adjusting capacitor. FIG. 3 is a circuit diagram illustrating the clock boost strapped switch circuit according to embodiments of the present invention. Please note some devices such as the conductive devices 207-213 and the voltage source 202 are omitted in the following diagrams for brevity.

Besides the switch 203 and the voltage adjusting capacitor 201 shown in FIG. 2, the switch circuit 300 further includes a switching module 301 and a switch 302. The switching module 301 is utilized to couple the voltage adjusting capacitor 201 to at least one of the switches 203 and 302. The input signals Vin1 and Vin2 received by the signal input terminals of the switches 203, 302 can be the same or different. As above-mentioned description, the switch circuit according to the present invention is not limited to be applied to the clock boost strapped switch circuit. Therefore, the devices included in the switch circuit according to the present invention can be summarized as follows: a plurality of switches, such as the switches 203 and 302 in FIG. 3; a switching module, such as 301 in FIG. 3; and a capacitor such as 201 in FIG. 3. The capacitor 201 has a first terminal such as 206 and a second terminal such as 204. The first terminal is coupled to a predetermined voltage such as Vdc, and the second terminal is selectively coupled to a control terminal of at least one of the switches in a conductive mode such as the mode in FIG. (b) of FIG. 2 via the switching module, to thereby control a conductive state for the at least one of the switches.

Figure 4:
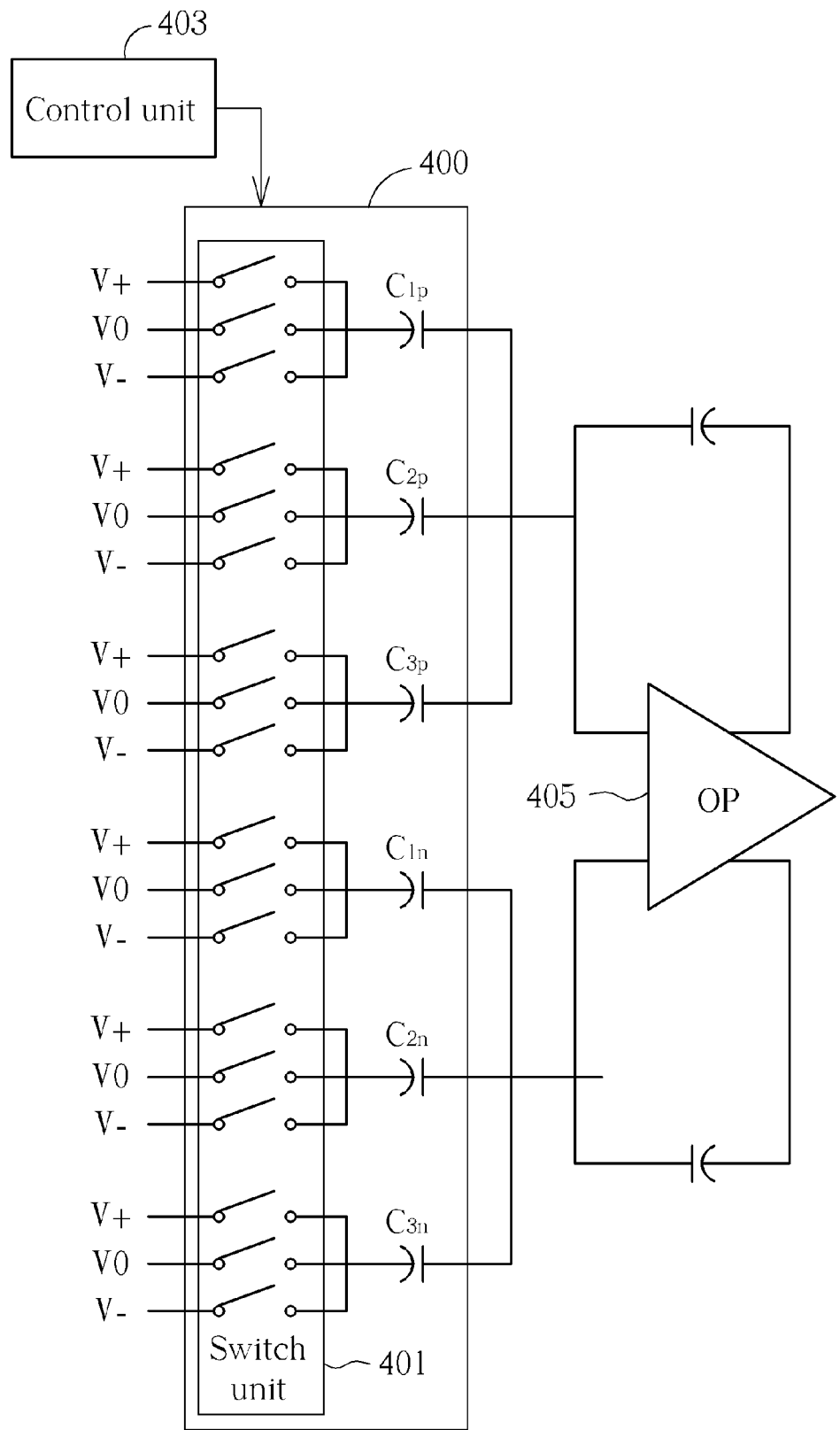
FIG. 4 is a circuit diagram illustrating a switch capacitor circuit utilizing the switch circuit shown in FIG. 3.

FIG. 4 is a circuit diagram illustrating a switch capacitor circuit 400 utilizing the switch circuit shown in FIG. 3. Please refer to FIG. 4, the switch capacitor circuit 400 includes a plurality of capacitors C1p-C3p,C1n-C3n, and a switch unit 401. The switch unit 401 includes a plurality of switches. Each of the switches can be applied to the devices 201, 203, 205 and 301 of the clock boost strapped switch circuit shown in FIG. 3 and can be controlled by a control unit 403. In this embodiment, the switch capacitor circuit 400 is applied to a differential signal amplifier 405. The capacitors C1p-C3p correspond to one signal input terminal and the capacitors C1n-C3n correspond to another signal input terminal. The signal passing thorough the capacitor C1p corresponds to the signal passing thorough the capacitor C1n, the signal passing thorough the capacitor C2p corresponds to the signal passing thorough the capacitor C2n, and the signal passing thorough the capacitor C3p corresponds to the signal passing thorough the capacitor C3n. Additionally, each capacitor can be coupled to three voltages V+, V0 and V− via the switch unit 401. The voltage V+ is higher than V−, and V0 is named a common voltage.

Figure 5:
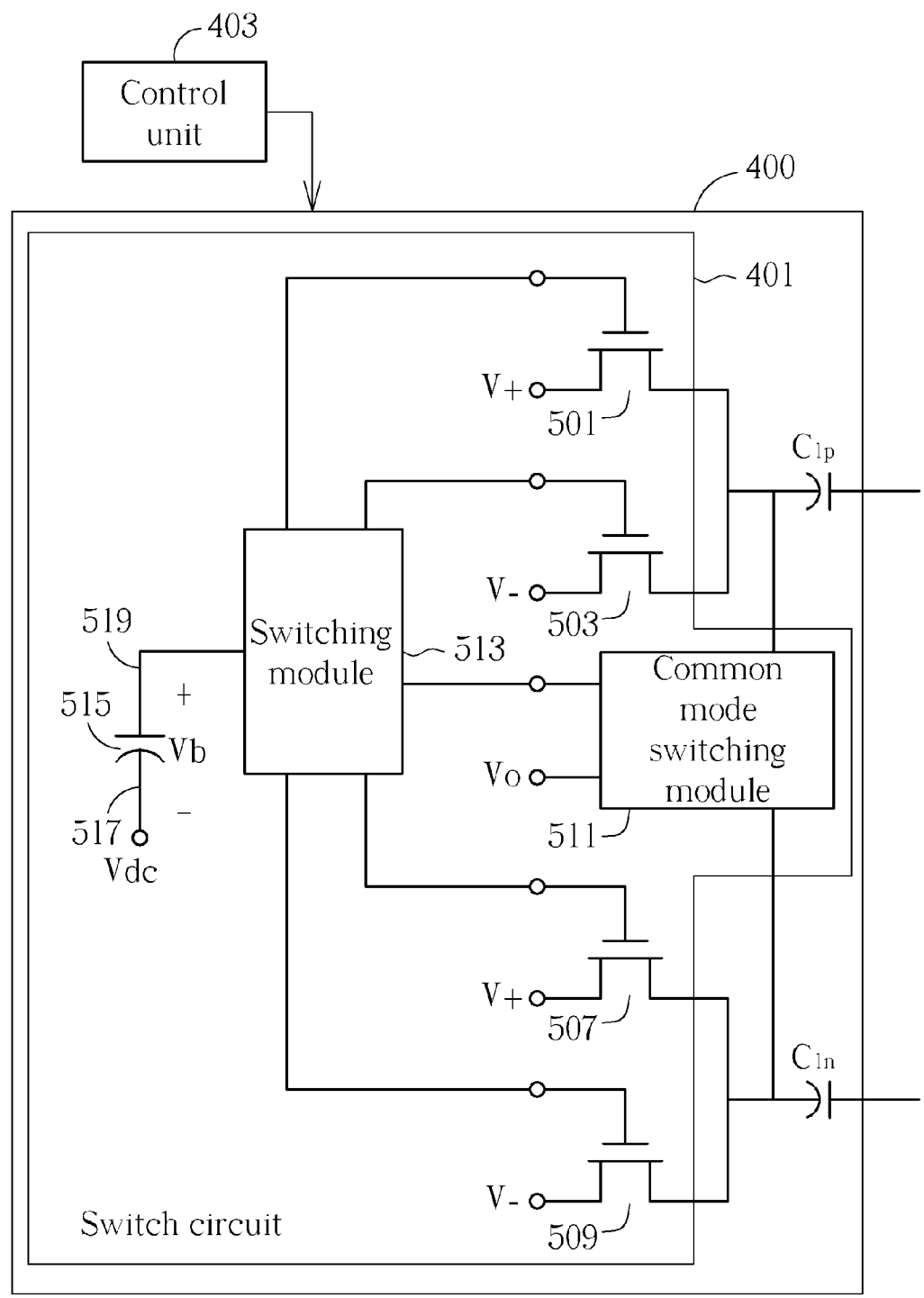
FIG. 5 is one exemplary embodiment of the detail circuit structures for the embodiment shown in FIG. 4.

FIG. 5 is one exemplary embodiment of the detail circuit structures for the embodiment shown in FIG. 4. Please note that only detail circuits for the capacitors C1p and C1n are illustrated in FIG. 5, other detail circuits for other capacitors are omitted for brevity. However, the same circuits can be applied to other capacitors C2p, C3p, C2n, and C3n. As shown in FIG. 5, the switch unit 401 includes a plurality of switches 501-511, a switching module 513 and a voltage adjusting capacitor 515. The voltage adjusting capacitor 515 has a first terminal 517 coupled to a predetermined voltage Vdc, and has a second terminal 519 can be selectively coupled to at least one of the switches 501-511 via the switching module 513. In one embodiment, the voltage adjusting capacitor 515 is coupled to a conductive switch via the switching module 513 once the switch of the switch unit 401 is conductive. In the following embodiments, a number of the switches that the voltage adjusting capacitor 515 is in the conductive mode is controlled by the control unit 403, such that resistance of the switches substantially maintains a constant value.

Please simultaneously refer to FIG. 4-FIG. 6 for the following concept. FIG. 6 is a schematic diagram illustrating each operating state for the switch capacitor circuit shown in FIG. 4. In FIG. 6, the mark V0 indicates the corresponding capacitor is coupled to V0, the mark "−" indicates the corresponding capacitor is coupled to V−. and the mark "+" indicates the corresponding capacitor is coupled to V+. For example, the operating state 1 indicates the capacitors C1p-C3p, C1n-C3n are coupled to V0. Also, the operating state 6 indicates the capacitors C1p and C2p are coupled to V−, and the capacitors C1n and C2n are coupled to V+. Also, if one of the capacitors belonging to the same differential pair is coupled to V−, the other one is consequentially coupled to V+. For example, if the capacitor C1p is coupled to V−, the capacitor C1n is consequentially coupled to V+. Moreover, if the capacitor C3p is coupled to V+, the capacitor C3n is consequentially coupled to V−.

Please note the mechanisms for coupling the capacitors C1p-C3p, C1n-C3n to V+/V−, and the mechanism for coupling the capacitors C1p-C3p, C1n-C3n to V0 are different. The corresponding switch is utilized while coupling to V+/V−. For example, the switch 503 in FIG. 5 is conductive if the capacitor C1p is coupled to V−, and the switch 507 in FIG. 5 is conductive if the capacitor C1n is coupled to V+. However, both the capacitors belonging to the same differential pair are coupled to the voltage V0, if anyone of them is conductive to V0. That is, if the capacitor C1p is conductive to V0, the capacitor C1n is consequently conductive to V0 rather than V+/V−. Similarly, the capacitor C2n is consequently conductive to V0 if the capacitor C2p is conductive to V0, and the capacitor C3n is consequently conductive to V0 if the capacitor C3p is conductive to V0. Therefore, the switch circuit 401 in FIG. 5 includes a common mode switching module 511, which includes a switch similar with the switches 501-511. The voltage adjusting capacitor 515 can be regarded as coupling to only one switch if the common mode switching module 511 is coupled to the voltage adjusting capacitor 515. The common mode switching module 511 is conductive if the capacitors C1p and C1n are desired to be coupled to V0, such that the capacitors C1p and C1n are conductive to each other and can both be coupled to V0. If the voltage adjusting capacitor 515 is not conductive to V0, the common mode switching module 511 controls the capacitors C1p and C1n to be nonconductive there between. Persons skilled in the art can easily understand how to use various kinds of circuits to reach the function of above-mentioned common mode switching module 511, thus the detail circuit of the common mode switching module 511 is omitted for brevity here.

Figure 7:
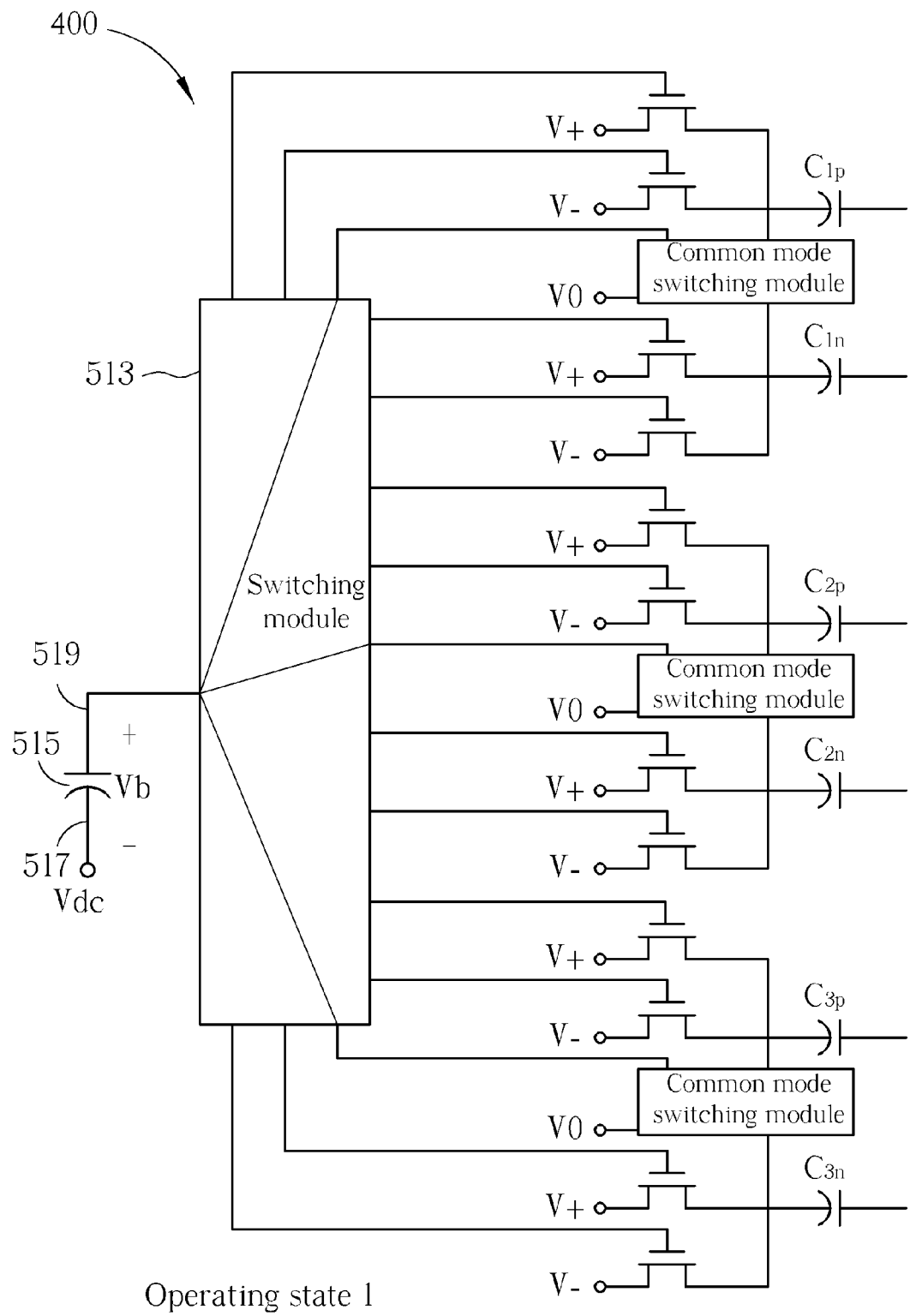
FIG. 7-FIG. 9 are circuit diagrams for three operating states of the embodiment shown in FIG. 4.
Figure 8:
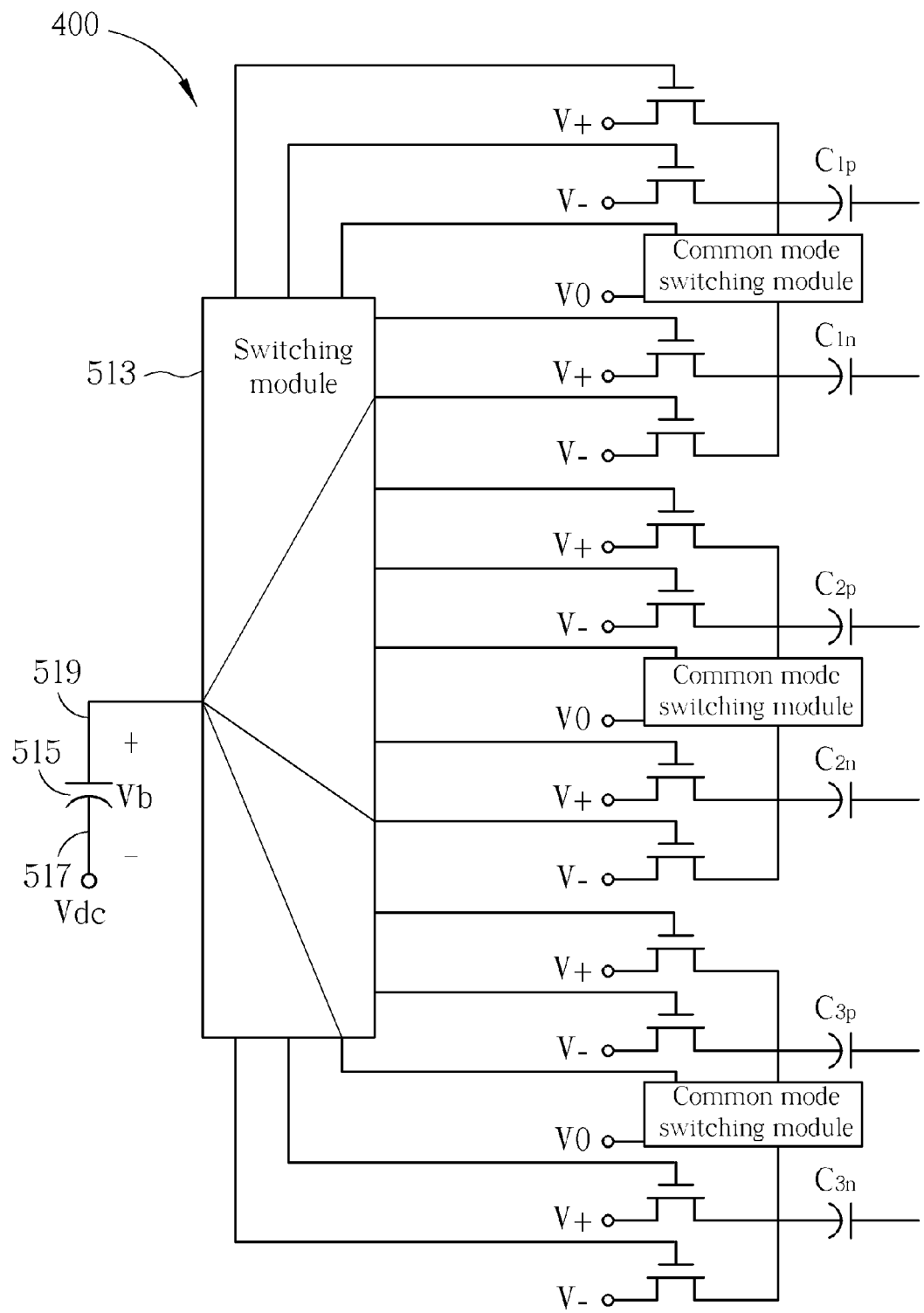
Figure 9:
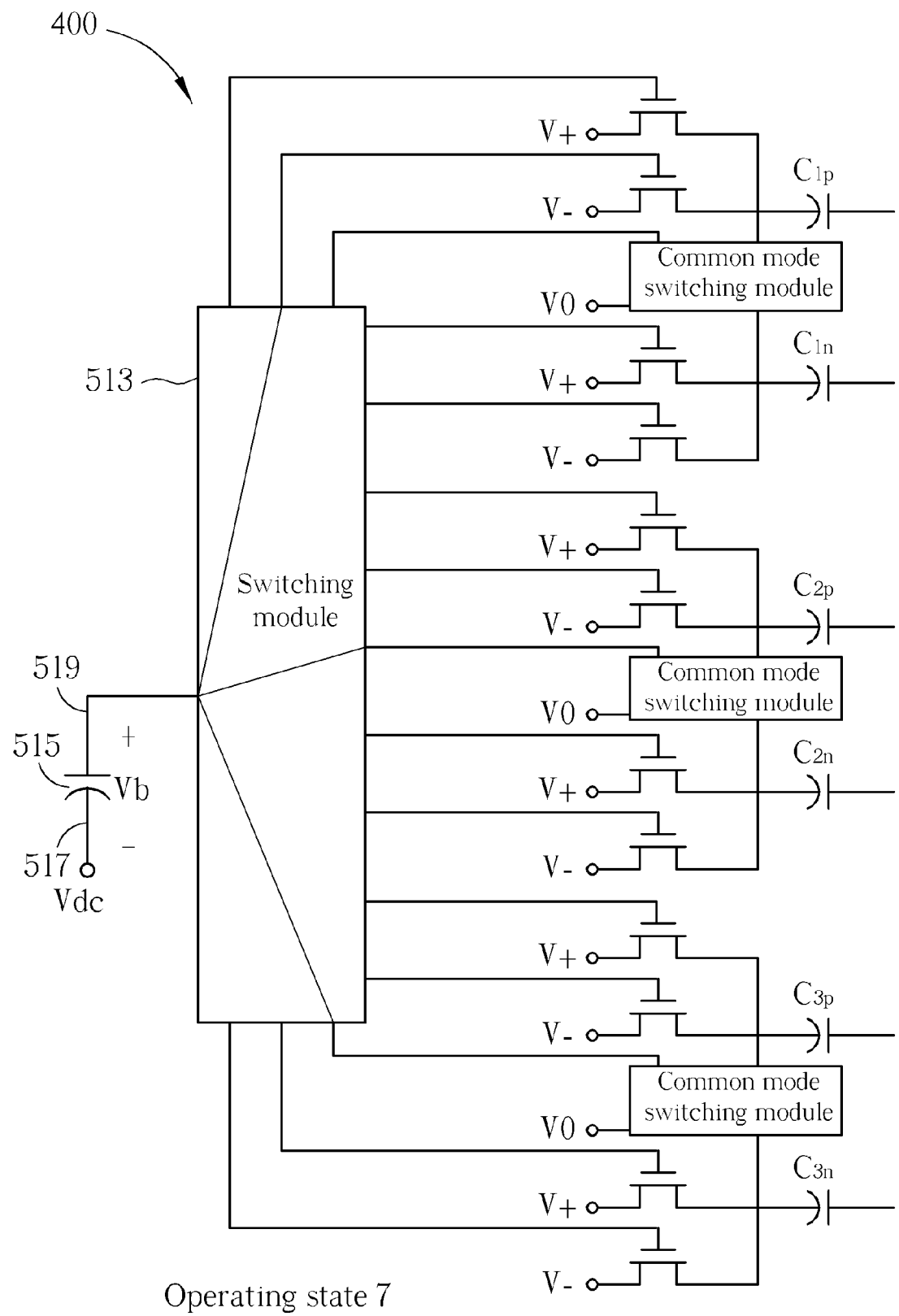

As described above, the number that the voltage adjusting capacitor 515 is in the conductive mode is fixed, such that the resistance generated by the switches in seven operating modes in FIG. 6 is substantially the same. Take the operating states shown in FIG. 6 for example, if the condition when the voltage adjusting capacitor 515 is coupled to the switch is set to be that the coupling is formed only when the capacitors couples to V0 and V−, the numbers for the switches are coupled are all three for all the operating states. FIG. 7 to FIG. 9 are circuit diagrams illustrating the connection relations between the switch capacitor 400 and the voltage adjusting capacitor 515, in the operating states 1, 4 and 7. Please simultaneously refer to the operating states in FIG. 6 and circuit diagrams in FIG. 7-FIG. 9 to understand the connections for the circuits in each operating state. Via these drawings, it can be clearly understood that the numbers of switches that the voltage adjusting capacitor 515 is coupled to are the same in each operating state. Accordingly, the resistance generated by the switches can be maintained at a predetermined value and the linearity of the switch capacitor circuit can be maintained as well. Please note another mechanism is utilized to control the switches to be conductive or non-conductive in the embodiments in FIG. 5 and FIG. 7 to FIG. 9. Such mechanism can be performed via software or hardware. For example, it can be implemented via an independent circuit, or implemented by writing program to a control unit. Persons skilled in the art can easily understand how to control the switch to be conductive or non-conductive, thus it is not depicted here.

In view of above-mentioned embodiments, a switch circuit controlling method can be acquired. The switch circuit controlling method is for controlling a switch circuit including a plurality of switches such as 203, 302 in FIG. 3, a switching module such as 301 in FIG. 3 and a capacitor such as 201 in FIG. 3. The capacitor includes a first terminal, such as 206 in FIG. 3, coupled to a predetermined voltage Vdc, and a second terminal, such as 204 in FIG. 3. The method has a control step to the second terminal of the capacitor to be coupled to a predetermined number of switches (ex. three switches in FIG. 6 to FIG. 9) in a conductive mode (ex. the state in FIG. (b) of FIG. 2). Alternatively, the switch circuit controlling method can have a step for controlling the number and the connection structure when the second terminal of the capacitor is coupled to the switch, such that the resistance for the switches to be coupled maintains at a fixed value. That is, the scope of the present invention is not limited to coupling the voltage adjusting capacitor to a predetermined number of switches. The scope of the present invention should cover the scope that any mechanism for maintaining the resistance for the switches that are coupled at a substantially fixed value via sharing a voltage adjusting capacitor. Besides, the switch circuit controlling method can be designed that only coupling the voltage adjusting capacitor to the switches utilizing NMOSFETs but not to the switches utilizing PMOSFETs, since a PMOSFET does not utilize the voltage adjusting capacitor to provide a cross voltage between the gate terminal and the source terminal. The PMOSFET is always applied as the switch receiving V+.

Additionally, a switch capacitor circuit controlling method for controlling a switch capacitor circuit can be acquired according to the embodiments shown in FIG. 4 to FIG. 9. The switch capacitor circuit includes a first capacitor such as C1p in FIG. 5, a first switch such as 501 in FIG. 5, a second switch such as 503 in FIG. 5, a switching module such as 513 in FIG. 5 and a voltage adjusting capacitor 515 in FIG. 5. The first switch includes a terminal coupled to a first input voltage such as V+ in FIG. 5. The second switch includes a terminal coupled to a second input voltage, which is lower than the first input voltage, such as V− in FIG. 5. The voltage adjusting capacitor has a first terminal coupled to a predetermined voltage, and has a second terminal. The switch capacitor circuit controlling method includes: control the second terminal of the voltage adjusting capacitor to be coupled to a control terminal of the second switch but not coupled to a control terminal of the first switch in a conductive mode. That is, the voltage adjusting capacitor is only coupled to the switches conductive to V−.

Additionally, the above-mentioned switch capacitor circuit can further comprise: a second capacitor such as C1n in FIG. 5; a third switch such as 507 in FIG. 5, comprising a first terminal coupled to the first input voltage; a fourth switch such as 509 in FIG. 5, comprising a first terminal coupled to the second input voltage such as V− in FIG. 5; and a common mode switching module such as 511 in FIG. 5. The common mode switching module controls the first capacitor and the second capacitor to be coupled with each other and controls the voltage adjusting capacitor to be coupled to the common mode switching module, when the first capacitor and the second capacitor are conductive to a third input voltage such as V0 in FIG. 5 via the common mode switching module. That is, the voltage adjusting capacitor is only coupled to the switch conductive to V0 and two capacitors. Please note the selection for coupling the voltage adjusting capacitor to V− or V0 can be independently performed or simultaneously performed. Such that the numbers for the switches are coupled are the same in different operating states of the switch capacitor circuit in above-mentioned embodiments, such that the resistance for the switches that are coupled substantially maintains at a fixed value.

In view of above-mentioned embodiments, the switch circuit according to the present invention can share a single voltage adjusting capacitor to a plurality of switches to significantly save circuit region. Also, the above-mentioned switch circuit controlling method and the switch capacitor circuit controlling method can control a number and a structure for the switches that the voltage adjusting capacitor is coupled to, such that the resistance for the switches that are coupled can maintain at a substantially fixed value.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch capacitor circuit, comprising:
    a plurality of switches, respectively comprising a first terminal, wherein the first terminals of the switches respectively receive an input voltage, wherein the input voltages received by different one of the switches are from different input voltage sources;
    a switching module;
    a voltage adjusting capacitor, for receiving a charging current thereby charged to a first predetermined voltage, having a first terminal and a second terminal, wherein the first terminal of the voltage adjusting capacitor is coupled to a predetermined voltage source, and the second terminal is selectively coupled to at least one of the plurality of switches via the switching module in a conductive mode, wherein the first terminal of the capacitor is not coupled to the input voltage sources;
    wherein the switches comprise:
    a first switch, comprising a first terminal coupled to a first input voltage; and
    a second switch, comprising a first terminal coupled to a second input voltage lower than the first input voltage;
    wherein the second terminal of the voltage adjusting capacitor is coupled to the second switch, not coupled to the first switch in the conductive mode;
    wherein the switch capacitor circuit further comprises:
    a first capacitor;
    a second capacitor;
    a third switch, comprising a first terminal coupled to the first input voltage;
    a fourth switch, comprising a first terminal coupled to the second input voltage; and
    a common mode switching module;
    wherein the common mode switching module controls the first capacitor and the second capacitor to be coupled with each other and controls the second terminal of the voltage adjusting capacitor to be coupled to the common mode switching module, when the first capacitor and the second capacitor are conductive to a third input voltage via the common mode switching module.

2. The switch capacitor circuit of claim 1, wherein the common mode switching module comprises a switch.

3. The switch capacitor circuit of claim 1, having a plurality of operating states, wherein a number of the switches that the second terminal of the voltage adjusting capacitor is coupled in the conductive mode is a fixed number for each operating states.

4. The switch capacitor circuit of claim 3, wherein a number of the switches is larger than the fixed number.

5. The switch capacitor circuit of claim 3, wherein the resistance of the switches substantially maintains a constant value.

6. The switch capacitor circuit of claim 1, wherein the switches are N type MOSFETs or P type MOSFETs, where the switching module only allows the second terminal of the capacitor to couple to the N type MOSFETs in the conductive mode.

7. The switch capacitor circuit of claim 1, wherein the first capacitor is utilized for an input terminal signal of a differential signal circuit, where the second capacitor is utilized for another input terminal signal for the differential signal circuit.

8. The switch capacitor circuit of claim 1, wherein the switching module comprises a first terminal and a plurality of second terminals, wherein the switches are respectively coupled to the second terminal of the switching module.

* * * * *